United States Patent
Lee et al.

(10) Patent No.: US 9,099,234 B2
(45) Date of Patent: Aug. 4, 2015

(54) FILTER FOR REMOVING NOISE AND METHOD OF MANUFACTURING THE SAME

(75) Inventors: Sang Moon Lee, Seoul (KR); Sung Kwon Wi, Seoul (KR); Jeong Bok Kwak, Gyeonggi-do (KR); Won Chul Sim, Gyeonggi-do (KR); Young Seuck Yoo, Seoul (KR); Yong Suk Kim, Gyeonggi-do (KR)

(73) Assignee: SAMSUNG ELECTRO-MECHANICS CO., LTD., Gyunggi-Do (KR)

( * ) Notice: Subject to any disclaimer, the term of this patent is extended or adjusted under 35 U.S.C. 154(b) by 408 days.

(21) Appl. No.: 13/427,829

(22) Filed: Mar. 22, 2012

(65) Prior Publication Data
US 2013/0162371 A1    Jun. 27, 2013

(30) Foreign Application Priority Data
Dec. 22, 2011  (KR) .................. 10-2011-0140411

(51) Int. Cl.
H03H 7/01    (2006.01)
H01F 17/00   (2006.01)
H03H 1/00    (2006.01)
H01F 3/10    (2006.01)

(52) U.S. Cl.
CPC ...... *H01F 17/0013* (2013.01); *H01F 2003/106* (2013.01); *H01F 2017/0066* (2013.01); *H03H 7/0153* (2013.01); *H03H 2001/0092* (2013.01)

(58) Field of Classification Search
CPC .................. Y03Y 4/0153; H03H 2001/0057; H03H 2001/0078
USPC ........................................... 333/185, 238, 246
See application file for complete search history.

(56) References Cited

U.S. PATENT DOCUMENTS 6,710,694 B2 *   3/2004   Matsuta et al. ............... 336/200
2006/0068330 A1 *  3/2006   Kamijima .................... 430/311

FOREIGN PATENT DOCUMENTS

JP    2009-283824    12/2009
JP    2010-062386    3/2010

* cited by examiner

*Primary Examiner* — Robert Pascal
*Assistant Examiner* — Gerald Stevens
(74) *Attorney, Agent, or Firm* — Bracewell & Giuliani LLP; Brad Y. Chin (57) ABSTRACT

The present invention discloses a filter for removing noise, which includes: a lower magnetic body; an insulating layer provided on the lower magnetic body and including at least one conductor pattern; and an upper magnetic body including a primary ferrite composite provided on the insulating layer and a secondary ferrite composite provided on the primary ferrite composite to cover a pore formed on a surface of the primary ferrite composite, and a method of manufacturing the same.

According to the present invention, it is possible to implement a filter for removing noise with high performance and characteristics by increasing magnetic permeability and improving impedance characteristics through simple structure and process.

6 Claims, 6 Drawing Sheets

FIG. 1

- PRIOR ART -

FIG. 2A

- PRIOR ART -

FIG. 2B

- PRIOR ART -

FIG. 2C

- PRIOR ART -

FIG. 3

- PRIOR ART -

FIG. 4

- PRIOR ART -

FILTER FOR REMOVING NOISE AND METHOD OF MANUFACTURING THE SAME

CROSS-REFERENCE TO RELATED APPLICATIONS

Claim and incorporate by reference domestic priority application and foreign priority application as follows:

CROSS REFERENCE TO RELATED APPLICATION

This application claims the benefit under 35 U.S.C. Section 119 of Korean Patent Application Serial No. 10-2011-0140411, entitled filed Dec. 22, 2011, which is hereby incorporated by reference in its entirety into this application.

BACKGROUND OF THE INVENTION

1. Field of the Invention

The present invention relates to a filter for removing noise, and more particularly, to a filter for removing noise that is capable of improving performance by increasing magnetic permeability and improving impedance characteristics through simple structure and process, and a method of manufacturing the same.

2. Description of the Related Art

Electronic products, such as digital TVs, smart phones, and notebook computers, have functions for data communication in radio-frequency bands. Such IT electronic products are expected to be more widely used since they have multifunctional and complex features by connecting not only one device but also USBs and other communication ports.

Here, for higher-speed data communication, data are communicated through more internal signal lines by moving from MHz frequency bands to GHz radio-frequency bands.

When more data are communicated between a main device and a peripheral device over a GHz radio-frequency band, it is difficult to provide smooth data processing due to signal delay and other noises.

Therefore, there is a need for immunity measures for preventing malfunctions due to external noises as well as preventing electronic products themselves from being noise sources.

In order to solve the above problem, an EMI prevention part is provided around the connection between an IT device and a peripheral device. However, conventional EMI prevention parts are used only in limited regions such as specific portions and large-area substrates since they are coil-type and stack-type and have large chip part sizes and poor electrical characteristics. Therefore, there is a need for EMI prevention parts that are suitable for slim, miniaturized, complex, and multifunctional features of electronic products.

A common-mode filter of EMI prevention coil parts in accordance with the prior art is described below in detail with reference to FIGS. 1 to 4.

Figure 1:
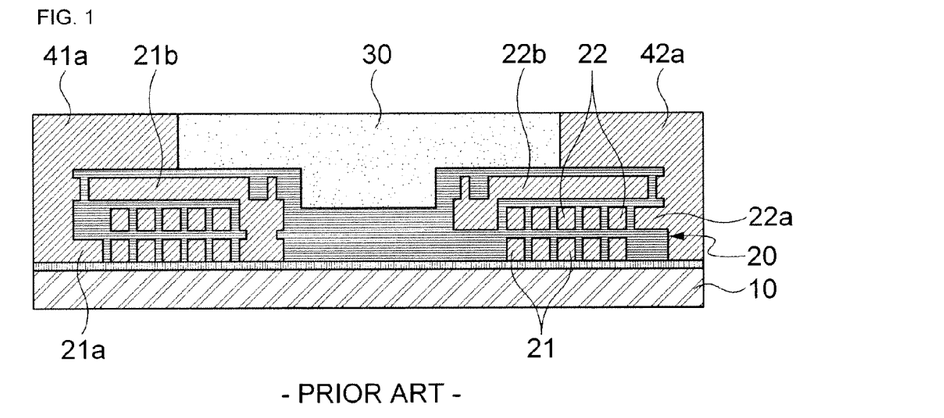
FIG. 1 is a cross-sectional view schematically showing a common-mode filter of conventional filters for removing noise.
Figure 2A:
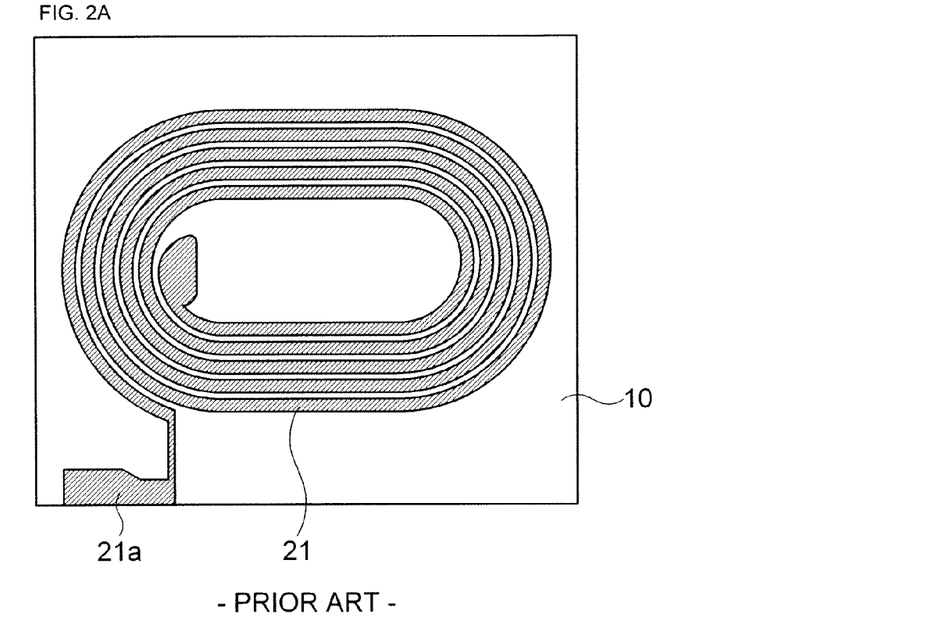
FIG. 2a is a plan view schematically showing a primary coil pattern of FIG. 1.
Figure 2B:
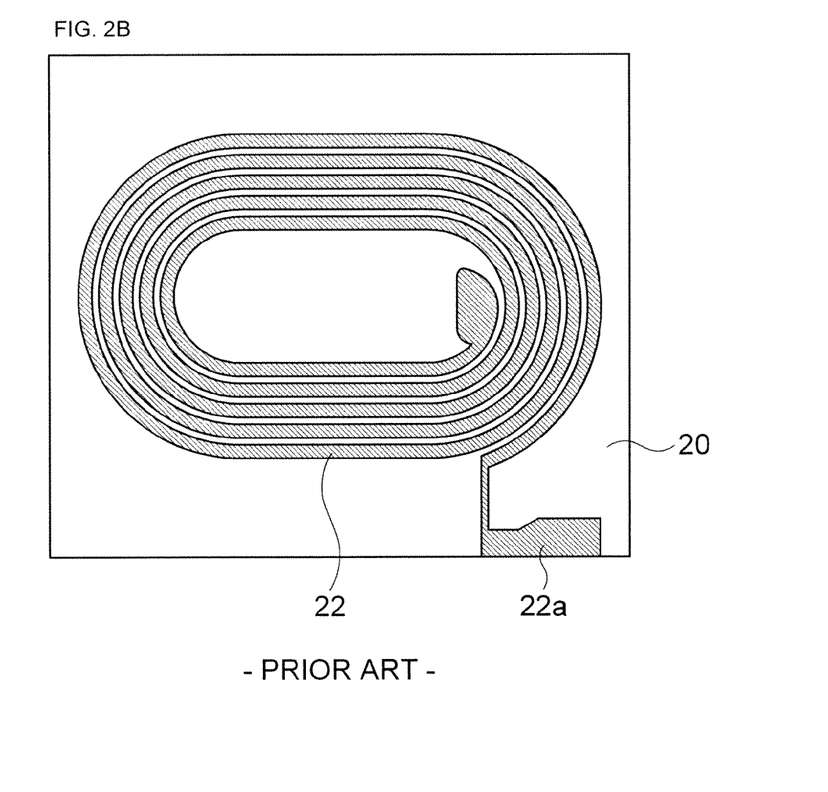
FIG. 2b is a plan view schematically showing a secondary coil pattern of FIG. 1.
Figure 2C:
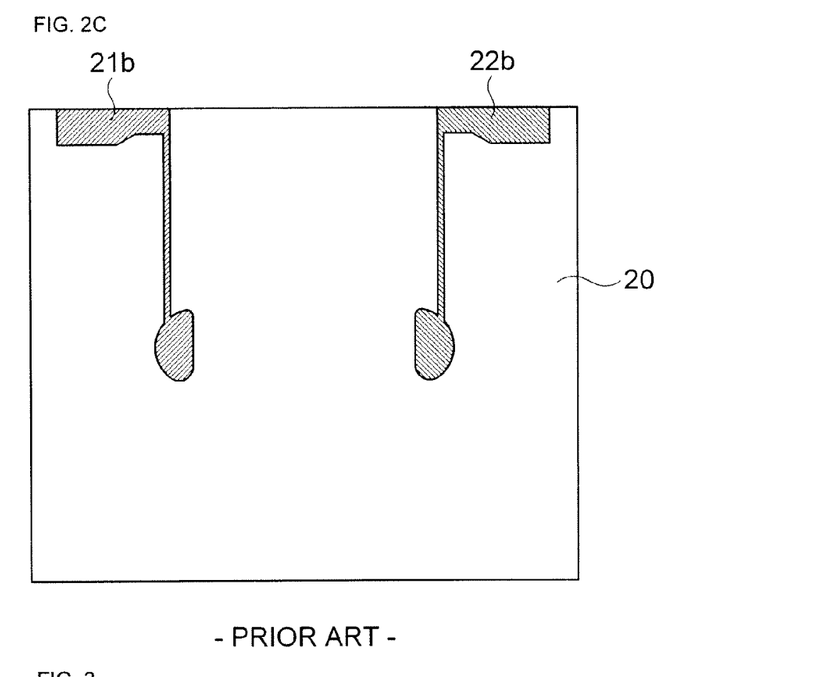
FIG. 2c is a plan view schematically showing an output-side lead pattern of the primary coil pattern of FIG. 2a and an output-side lead pattern of the secondary coil pattern of FIG. 2b.

Referring to FIGS. 1 to 2c, a conventional common-mode filter includes a lower magnetic substrate 10, an insulating layer 20 provided on the lower magnetic substrate 10 and including a first coil pattern 21 and a second coil pattern 22 which are vertically symmetrical to each other, and an upper magnetic body 30 provided on the insulating layer 20.

Here, the insulating layer 20 including the first coil pattern 21 and the second coil pattern 22 is formed on the lower magnetic substrate 10 through a thin-film process. An example of the thin-film process is disclosed in Japanese Patent Application Laid-Open No. 8-203737.

And, a first input lead pattern 21a and a first output lead pattern 21b for inputting and outputting electricity to and from the first coil pattern 21 are formed on the insulating layer 20. A second input lead pattern 22a and a second output lead pattern 22b for inputting and outputting electricity to and from the second coil pattern 22 are formed on the insulating layer 20.

In more detail, the insulating layer 20 consists of a first coil layer including the first coil pattern 21 and the first input lead pattern 21a, a second coil layer including the second coil pattern 22 and the second input lead pattern 22a, and a third coil layer including the first output lead pattern 21b and the second output lead pattern 22b.

That is, the first coil layer is formed by coating an insulating material after forming the first coil pattern 21 and the first input lead pattern 21a on an upper surface of the lower magnetic substrate 10 through a thin-film process.

And, the second coil layer is formed by coating an insulating material after forming the second coil pattern 22 corresponding to the first coil pattern 21 and the second input lead pattern 22a on an upper surface of the first coil layer through a thin-film process.

Next, the third coil layer is formed by coating an insulating material after forming the first output lead pattern 21b and the second output lead pattern 22b on an upper surface of the second coil layer through a thin-film process for external output of the first coil pattern 21 and the second coil pattern 22.

At this time, the first coil pattern 21 and the second coil pattern 22 may be electrically connected to the first output lead pattern 21b and the second output lead pattern 22b through via connection structures, respectively.

And, the first input lead pattern 21a is connected to a first input stud terminal 41a, the first output lead pattern 21b is connected to a first output stud terminal 41b corresponding to the first input stud terminal 41a, the second input lead pattern 22a is connected to a second input stud terminal 42a, and the second output lead pattern 22b is connected to a second output stud terminal 42b corresponding to the second input stud terminal 42a.

Although not shown in detail, the first coil layer to the third coil layer may be formed in a sheet shape and combined in a stack-type to configure the above-described insulating layer including the first and second coil patterns, the first and second input lead patterns, and the first and second output lead patterns.

Meanwhile, in the conventional common-mode filter configured as above, in order to improve adhesion and insulation with the insulating layer 20 and withstand voltage characteristics, the upper magnetic body 30 is formed by filling a composite material in which a resin as a binder is mixed in ferrite. At this time, when the amount of the mixed resin is too much, magnetic permeability of the common-mode filter is remarkably reduced, thus causing deterioration of performance and characteristics of the common-mode filter.

When a particle size of the ferrite powder constituting the upper magnetic body 30 is increased to increase magnetic permeability, radio-frequency characteristics of the common-mode filter are deteriorated, and when the amount of the resin as a binder of the upper magnetic body 30 is reduced, the adhesion, insulation, and withstand voltage characteristics of the upper magnetic body 30 are deteriorated.

Further, as another method of increasing magnetic permeability, there is a method of providing a high-temperature environment when forming the upper magnetic body 30, but there are problems such as deterioration of workability, increase of equipment for increasing a temperature, and deterioration of reliability of the common-mode filter in the high-temperature environment.

Meanwhile, after the upper magnetic body 30 is formed by filling the composite material, in which the resin is mixed in the ferrite powder, on the insulating layer 20 and curing the composite material, a polishing process for surface polishing is performed on a surface of the upper magnetic body 30. At this time, there is a problem that the ferrite powder falls from the surface of the upper magnetic body 30.

Figure 3:
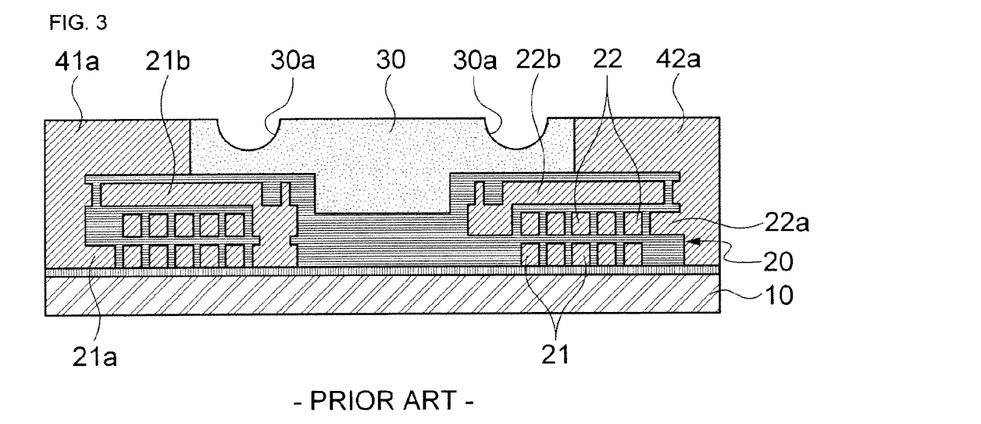
FIG. 3 is a cross-sectional view schematically showing a state after a surface of an upper magnetic body of the filter for removing noise of FIG. 1 is polished.
Figure 4:
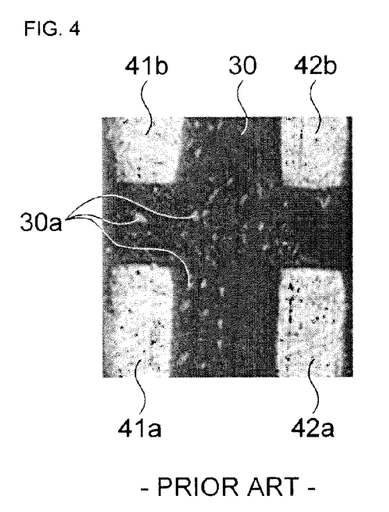
FIG. 4 is a plan photograph showing the surface of the upper magnetic body of FIG. 3.

In more detail, referring to FIGS. 3 and 4, in order to prevent a decrease in magnetic permeability of the upper magnetic body 30, it is preferred that a mixing ratio of the resin to the ferrite powder is about 10% by weight. By this, it is possible to uniformly maintain the adhesion of the upper magnetic body 30 with respect to the insulating layer 20, but the adhesion of the upper magnetic body 30 is insufficient to combine the ferrite powder compared to a pressing force applied to the surface of the upper magnetic body 30 during the polishing process. Accordingly, the ferrite powder falls from the surface of the upper magnetic body 30 by the pressing force applied to the surface of the upper magnetic body 30 during the polishing process and a pore 30a is formed in a portion of the surface of the upper magnetic body 30, from which the ferrite powder is fallen.

Therefore, magnetic permeability and impedance characteristics of the common-mode filter are deteriorated by the pore 30a formed in the surface of the upper magnetic body 30, thus causing degradation of performance and reliability.

SUMMARY OF THE INVENTION

The present invention has been invented in order to overcome the above-described problems and it is, therefore, an object of the present invention to provide a filter for removing noise that is capable of improving performance and reliability by increasing magnetic permeability while maintaining high adhesion, insulation, and withstand voltage characteristics of an upper magnetic body and thus improving impedance characteristics, and a method of manufacturing the same.

It is another object of the present invention to provide a filter for removing noise that is capable of improving productivity and preventing an increase in manufacturing costs accompanied when increasing magnetic permeability by increasing magnetic permeability through simple structure and process and thus preventing an increase in equipment for improving magnetic permeability, and a method of manufacturing the same.

It is still another object of the present invention to provide a filter for removing noise that is capable of improving performance and reliability by preventing or minimizing pores formed on a surface of an upper magnetic body or minimizing a size of the pore and thus preventing a decrease in magnetic permeability to improve impedance characteristics, and a method of manufacturing the same.

In accordance with one aspect of the present invention to achieve the object, there is provided a filter for removing noise including: a lower magnetic body; an insulating layer provided on the lower magnetic body and including at least one conductor pattern; and an upper magnetic body including a primary ferrite composite provided on the insulating layer and a secondary ferrite composite provided on the primary ferrite composite to cover a pore formed on a surface of the primary ferrite composite.

The primary ferrite composite and the secondary ferrite composite may include ferrite powder and polymers.

Here, a particle size of the ferrite powder of the secondary ferrite composite may be smaller than that of the ferrite powder of the primary ferrite composite.

As an example, the particle size of the ferrite powder of the primary ferrite composite may be 20 to 35 μm, and the particle size of the ferrite powder of the secondary ferrite composite may be 0.01 to 3 μm.

The ferrite powder and the polymer constituting the primary ferrite composite may have a mixing ratio of 9:1 by weight, and the ferrite powder and the polymer constituting the secondary ferrite composite may have a mixing ratio of 7:3 by weight.

Each of the primary ferrite composite and the secondary ferrite composite may further include a dispersant.

The pore may be formed during a polishing process of the primary ferrite composite, and the secondary ferrite composite may be filled on a surface of the primary ferrite composite including the pore.

Each of the primary ferrite composite and the secondary ferrite composite may be provided through a deaeration process for removing voids inside, a leveling process for stabilization and curing, and a polishing process for surface polishing, after being filled.

In accordance with another aspect of the present invention to achieve the object, there is provided a method of manufacturing a filter for removing noise including the steps of: preparing an insulating layer including at least one conductor pattern; providing a primary ferrite composite on the insulating layer; and providing a secondary ferrite composite to cover a pore formed on a surface of the primary ferrite composite.

The method of manufacturing a filter for removing noise may include the steps of polishing the surface of the primary ferrite composite after providing the primary ferrite composite and polishing a surface of the secondary ferrite composite after providing the secondary ferrite composite.

The primary ferrite composite and the secondary ferrite composite may include ferrite powder and polymers.

Here, a particle size of the ferrite powder of the secondary ferrite composite may be smaller than that of the ferrite powder of the primary ferrite composite.

In more detail, the particle size of the ferrite powder of the primary ferrite composite may be 20 to 35 μm, and the particle size of the ferrite powder of the secondary ferrite composite may be 0.01 to 3 μm.

The ferrite powder and the polymer constituting the primary ferrite composite may have a mixing ratio of 9:1 by weight, and the ferrite powder and the polymer constituting the secondary ferrite composite may have a mixing ratio of 7:3 by weight.

Each of the primary ferrite composite and the secondary ferrite composite may further include a dispersant.

The step of providing the secondary ferrite composite may include the step of filling the secondary ferrite composite on the surface of the primary ferrite composite including the pore.

The step of providing the primary ferrite composite and the step of providing the secondary ferrite composite may further include a deaeration process for removing voids inside, a leveling process for stabilization and curing, and a polishing process for surface polishing, respectively.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 8a to 8c are process diagrams schematically showing an embodiment of a method of manufacturing a filter for removing noise in accordance with the present invention, wherein

DETAILED DESCRIPTION OF THE PREFERABLE EMBODIMENTS

Advantages and features of the present invention and methods of accomplishing the same will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Further, embodiments to be described throughout the specification will be described with reference to cross-sectional views and/or plan views, which are ideal exemplary drawings of the present invention. In the drawings, the thicknesses of layers and regions may be exaggerated for the effective explanation of technical contents. Therefore, the exemplary drawings may be modified by manufacturing techniques and/or tolerances. Therefore, the embodiments of the present invention are not limited to the accompanying drawings, and can include modifications to be generated according to manufacturing processes. For example, an etched region shown at a right angle may be formed in the rounded shape or formed to have a predetermined curvature. Therefore, regions shown in the drawings have schematic characteristics. In addition, the shapes of the regions shown in the drawings exemplify specific shapes of regions in an element, and do not limit the invention.

Hereinafter, embodiments of a filter for removing noise and a method of manufacturing the same in accordance with the present invention will be described in detail with reference to FIGS. 5 to 8c.

Figure 5:
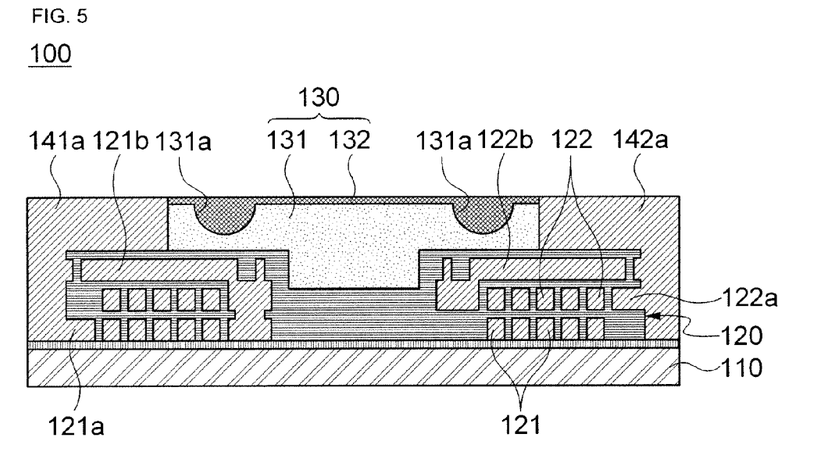
FIG. 5 is a cross-sectional view schematically showing an embodiment of a filter for removing noise in accordance with the present invention.
Figure 6:
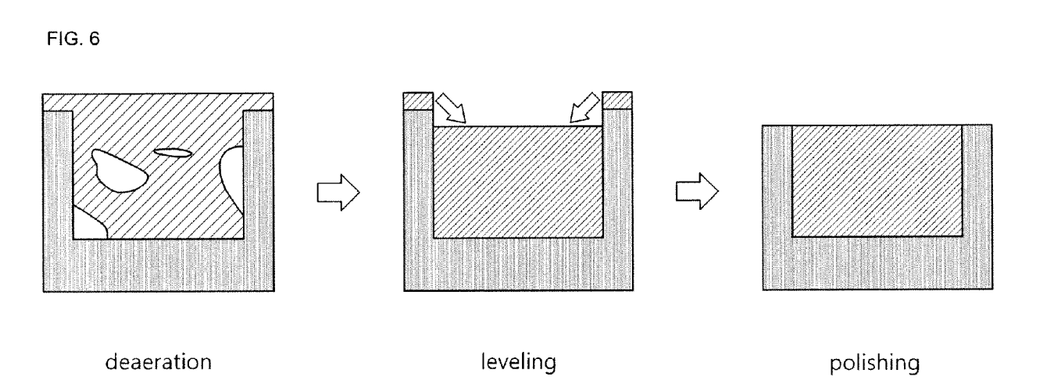
FIG. 6 is a process diagram schematically showing a deaeration process, a leveling process, and a polishing process included in manufacturing processes of a primary ferrite composite and a secondary ferrite composite of the filter for removing noise in accordance with the present invention.
Figure 7:
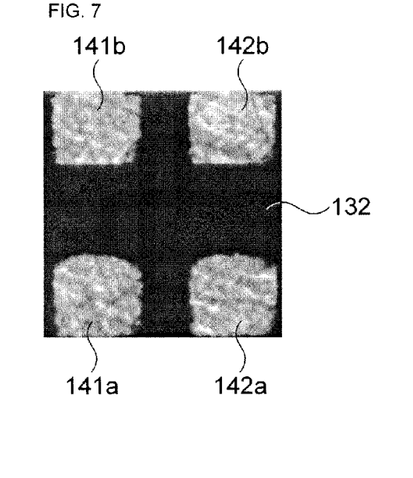
FIG. 7 is a plan photograph showing a surface of the secondary ferrite composite of the filter for removing noise of FIG. 5.

FIG. 5 is a cross-sectional view schematically showing an embodiment of a filter for removing noise in accordance with the present invention, FIG. 6 is a process diagram schematically showing a deaeration process, a leveling process, and a polishing process included in manufacturing processes of a primary ferrite composite and a secondary ferrite composite of the filter for removing noise in accordance with the present invention, and FIG. 7 is a plan photograph showing a surface of the secondary ferrite composite of the filter for removing noise of FIG. 5.

Figure 8A:
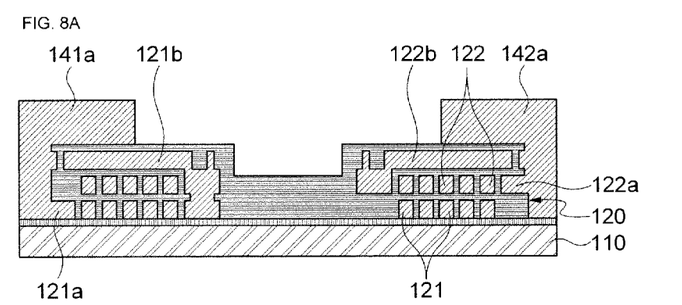
FIG. 8a is a cross-sectional view schematically showing a state in which an insulating layer including a primary conductor pattern and a secondary conductor pattern is provided on a lower magnetic body.
Figure 8B:
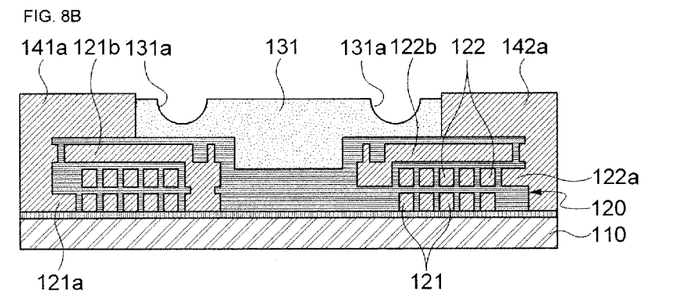
FIG. 8b is a cross-sectional view schematically showing a state in which a primary ferrite composite is provided on the insulating layer in the state of FIG. 8a, and FIG. 8c is a cross-sectional view schematically showing a state in which a secondary ferrite composite is provided in the state of FIG. 8b.
Figure 8C:
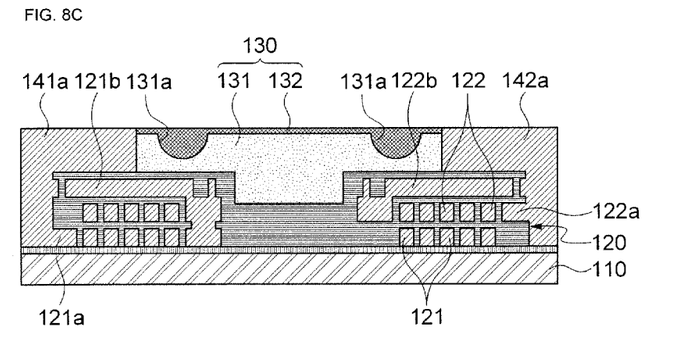

And, FIGS. 8a to 8c are process diagrams schematically showing an embodiment of a method of manufacturing a filter for removing noise in accordance with the present invention, wherein FIG. 8a is a cross-sectional view schematically showing a state in which an insulating layer including a primary conductor pattern and a secondary conductor pattern is provided on a lower magnetic body, FIG. 8b is a cross-sectional view schematically showing a state in which a primary ferrite composite is provided on the insulating layer in the state of FIG. 8a, and FIG. 8c is a cross-sectional view schematically showing a state in which a secondary ferrite composite is provided in the state of FIG. 8b.

First, an embodiment of a filter for removing noise in accordance with the present invention will be described with reference to FIGS. 5 to 7.

Referring to FIGS. 5 and 7, an embodiment 100 of a filter for removing noise in accordance with the present invention may include a lower magnetic body 110, an insulating layer 120 provided on the lower magnetic body 110 and including a primary conductor pattern 121 and a secondary conductor pattern 122, and an upper magnetic body 130 provided in a cavity formed on the insulating layer 120.

And, a first input lead pattern 121a and a first output lead pattern 121b for inputting and outputting electricity to and from the primary conductor pattern 121 may be formed on the insulating layer 120, and a second input lead pattern 122a and a second output lead pattern 122b for inputting and outputting electricity to and from the secondary conductor pattern 122 may be formed on the insulating layer 120.

Further, the filter 100 for removing noise of this embodiment may include first and second input stud terminals 141a and 142a, which are electrically connected to the first and second input lead patterns 121a and 122a to supply electricity to the first and second input lead patterns 121a and 122a from the outside, and first and second output stud terminals 141b and 142b, which are electrically connected to the first and second output lead patterns 121b and 122b to output the electricity supplied to the primary and secondary conductor patterns 121 and 122 to the outside.

Meanwhile, in this embodiment, the upper magnetic body 130 may include a primary ferrite composite 131 provided in the cavity and a secondary ferrite composite 132 which covers a pore 131a formed on a surface of the primary ferrite composite 131 during a process of polishing the surface of the primary ferrite composite 131.

Here, each of the primary ferrite composite 131 and the secondary ferrite composite 132 may include ferrite powder and a polymer.

At this time, it is preferred that a particle size of the ferrite powder of the secondary ferrite composite 132 is smaller than that of the ferrite powder of the primary ferrite composite 131

As an example, the particle size of the ferrite powder of the primary ferrite composite 131 may be 20 to 35 μm, and the particle size of the ferrite powder of the secondary ferrite composite 132 may be 0.01 to 3 μm.

Further, the ferrite powder and the polymer constituting the primary ferrite composite 131 may have a mixing ratio of 9:1 by weight, and the ferrite powder and the polymer constituting the secondary ferrite composite 132 may have a mixing ratio of 7:3 by weight.

In other words, the filter 100 for removing noise of this embodiment can minimize or prevent falling of the ferrite powder during a polishing process for surface polishing of the secondary ferrite composite 132 by covering the pore 131a formed on the surface of the primary ferrite composite 131 with the secondary ferrite composite 132 including the ferrite powder finer than the ferrite powder of the primary ferrite composite 131 and increasing the amount of the polymer mixed in the secondary ferrite composite 132, thereby minimizing or preventing generation of pores on the surface of the secondary ferrite composite 132 or minimizing a size of the pore as in FIG. 7.

Therefore, it is possible to remarkably increase magnetic permeability compared to the prior art by minimizing or preventing a decrease in magnetic permeability of the upper magnetic body 130 including the primary ferrite composite 131 and the secondary ferrite composite 132. Accordingly, it is possible to improve performance and reliability of the product by improving impedance characteristics.

Meanwhile, each of the primary ferrite composite 131 and the secondary ferrite composite 132 may further include a dispersant.

Therefore, it is possible to induce uniform distribution of the ferrite powder in each ferrite composite by increasing dispersibility of the ferrite powder when the ferrite powder and the polymer are mixed. Accordingly, it is possible to provide uniform magnetic permeability to the filter for removing noise. Due to this, it is possible to improve impedance characteristics.

Meanwhile, referring to FIG. 6, each of the primary ferrite composite 131 and the secondary ferrite composite 132 may go through a deaeration process for removing a vacuum, that is, voids and solvents included in the filled mixture of the ferrite powder and the polymer, a leveling process for uniformly filling the mixture in the entire filling space and stabilizing and curing the mixture after the deaeration process, and a polishing process for removing the mixture overfilled during the leveling process and polishing a surface of the mixture, after being filled.

Next, an embodiment of a method of manufacturing a filter for removing noise in accordance with the present invention will be described with reference to FIGS. 8a to 8c.

First, referring to FIG. 8a, a lower magnetic body 110, which is manufactured in the form of a ferrite substrate, is prepared, and an insulating layer 120 including a primary conductor pattern 121, a secondary conductor pattern 122, and first and second input and output lead patterns 121a, 121b, 122a, and 122b formed at input and output sides of the respective primary and secondary conductor patterns 121 and 122 is formed on the lower magnetic body 110.

And, first and second input and output stud terminals 141a, 141b, 142a, and 142b, which are electrically connected to the first and second input and output lead patterns 121a, 121b, 122a, and 122b, are formed. Here, the first and second output stud terminals 141b and 142b are shown in FIG. 7.

Next, as shown in FIG. 8b, a primary ferrite composite 131 is filled in a cavity formed on the insulating layer 120, that is, a space formed by the interval between the first and second input and output stud terminals 141a, 141b, 142a, and 142b.

Here, the primary ferrite composite 131 may include ferrite powder and a polymer, a particle size of the ferrite powder of the primary ferrite composite 131 may be about 20 to 35 μm, and the ferrite powder and the polymer may be mixed at a mixing ratio of 9:1.

And, a polishing process is performed for surface polishing of the primary ferrite composite 131.

At this time, the ferrite powder constituting the primary ferrite composite 131 may be fallen by a pressing force applied to the surface of the primary ferrite composite 131 during the polishing process and thus a pore 131a may be formed on the surface of the primary ferrite composite 131.

Due to this, in this embodiment, as shown in FIG. 8c, a secondary ferrite composite 132, which covers the pore 131a formed on the surface of the primary ferrite composite 131, may be filled on the surface of the primary ferrite composite 131.

Here, the secondary ferrite composite 132 may also include ferrite powder and a polymer, and a particle size of the ferrite powder of the secondary ferrite composite 132 may be smaller than that of the ferrite powder of the primary ferrite composite 131. As an example, the particle size of the ferrite powder of the secondary ferrite composite 132 may be 0.01 to 3 μm.

Further, the ferrite powder and the polymer constituting the secondary ferrite composite 132 may have a mixing ratio of 7:3 by weight.

Therefore, the polymer component of the secondary ferrite composite 132 is increased compared to that of the primary ferrite composite 131 to increase adhesion with respect to the ferrite powder. Accordingly, it is possible to minimize or prevent generation of pores on the surface of the secondary ferrite composite 132 by minimizing or preventing falling of the ferrite powder during the polishing process for surface polishing of the secondary ferrite composite 132.

In other words, in accordance with this embodiment, it is possible to minimize or prevent falling of the ferrite powder during the polishing process for surface polishing of the secondary ferrite composite 132 by covering the pore 131a formed on the surface of the primary ferrite composite 131 with the secondary ferrite composite 132 including the ferrite powder finer than the ferrite powder of the primary ferrite composite 131 and increasing the amount of the polymer mixed in the secondary ferrite composite 132, thereby minimizing or preventing generation of the pores on the surface of the secondary ferrite composite 132 or minimizing a size of the pore as in FIG. 7.

Further, it is possible to remarkably increase magnetic permeability compared to the prior art by minimizing or preventing a decrease in magnetic permeability of the upper magnetic body 130 including the primary ferrite composite 131 and the secondary ferrite composite 132. Accordingly, it is possible to improve performance and reliability of the product by improving impedance characteristics.

Meanwhile, each of the primary ferrite composite 131 and the secondary ferrite composite 132 may further include a dispersant. Accordingly, it is possible to induce uniform distribution of the ferrite powder in each ferrite composite by increasing dispersibility of the ferrite powder when the ferrite powder and the polymer are mixed.

On the other hand, as described above, a process of providing the primary ferrite composite 131 and a process of providing the secondary ferrite composite 132 may further include a deaeration process for removing voids inside, a leveling process for stabilization and curing, and a polishing process for surface polishing, respectively. At this time, the polishing process means the above-described polishing process of the primary ferrite composite 131 and the secondary ferrite composite 132.

As described above, according to the filter for removing noise and the method of manufacturing the same in accordance with the present invention, it is possible to improve performance and reliability of a product by increasing magnetic permeability while maintaining high adhesion, insulation, and withstand voltage characteristics of an upper magnetic body and thus improving impedance characteristics of the filter for removing noise.

And, according to the filter for removing noise and the method of manufacturing the same in accordance with the present invention, it is possible to improve productivity and reducing manufacturing costs due to an increase in equipment for increasing magnetic permeability by increasing magnetic permeability through simple structure and process.

Further, according to the filter for removing noise and the method of manufacturing the same in accordance with the present invention, it is possible to improve performance and reliability by preventing or minimizing pores formed on a surface of an upper magnetic body or minimizing a size of the pore and thus preventing a decrease in magnetic permeability to improve impedance characteristics.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A filter for removing noise, which comprises:
   a lower magnetic body;
   an insulating layer provided on the lower magnetic body and including at least one conductor; and
   an upper magnetic body including a primary ferrite composite provided on the insulating layer and a secondary ferrite composite provided on the primary ferrite composite to cover a pore formed on one surface of the primary ferrite composite,
   wherein the secondary ferrite composite is contacted with the one surface of the primary ferrite composite including the pore,
   wherein the pore has a recessed shape from the one surface of the primary ferrite composite to another surface of the primary ferrite composite and is filled with the secondary ferrite composite.

2. The filter for removing noise according to claim 1, wherein the primary ferrite composite and the secondary ferrite composite comprise ferrite powder and polymers and the pore is made by being fallen of the ferrite powder from the primary ferrite composite.

3. The filter for removing noise according to claim 2, wherein a particle size of the ferrite powder of the secondary ferrite composite is smaller than that of the ferrite powder of the primary ferrite composite.

4. The filter for removing noise according to claim 3, wherein the particle size of the ferrite powder of the primary ferrite composite is 20 to 35 µm, and the particle size of the ferrite powder of the secondary ferrite composite is 0.01 to 3 µm.

5. The filter for removing noise according to claim 2, wherein the ferrite powder of the polymer constituting the primary ferrite composite have a mixing ratio of 9:1 by weight, and the ferrite powder and the polymer constituting the secondary ferrite composite have a mixing ratio of 7:3 by weight.

6. The filter for removing noise according to claim 2, wherein each of the primary ferrite composite and the secondary ferrite composite further comprises a dispersant.

* * * * *